US008957395B2

(12) United States Patent
Peijster et al.

(10) Patent No.: US 8,957,395 B2
(45) Date of Patent: Feb. 17, 2015

(54) CHARGED PARTICLE BEAM LITHOGRAPHY SYSTEM AND TARGET POSITIONING DEVICE

(71) Applicants: Jerry Peijster, Maartensdijik (NL); Guido de Boer, Leerdam (NL)

(72) Inventors: Jerry Peijster, Maartensdijik (NL); Guido de Boer, Leerdam (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 14/221,204

(22) Filed: Mar. 20, 2014

(65) Prior Publication Data

US 2014/0203187 A1    Jul. 24, 2014

Related U.S. Application Data

(63) Continuation of application No. 12/542,478, filed on Aug. 17, 2009, now Pat. No. 8,796,644.

(60) Provisional application No. 61/089,744, filed on Aug. 18, 2008.

(51) Int. Cl.
*H01J 37/20*     (2006.01)
*H01J 37/317*    (2006.01)

(52) U.S. Cl.
CPC ............ *H01J 37/20* (2013.01); *H01J 37/3174* (2013.01); *H01J 2237/20264* (2013.01); *H01J 2237/20278* (2013.01); *H01J 2237/20292* (2013.01)
USPC .................. 250/491.1; 250/492.1; 250/453.11

(58) Field of Classification Search
USPC .................................................... 250/491.1
See application file for complete search history.

(56) References Cited

U.S. PATENT DOCUMENTS

| 4,514,858 | A | | 4/1985 | Novak |
| 4,993,696 | A | | 2/1991 | Furukawa et al. |
| 5,073,912 | A | | 12/1991 | Kobayashi et al. |
| 5,616,980 | A | | 4/1997 | Zumeris |
| 5,623,853 | A | | 4/1997 | Novak et al. |
| 5,684,856 | A | * | 11/1997 | Itoh et al. .................. 378/34 |
| 5,760,564 | A | * | 6/1998 | Novak ...................... 318/687 |
| 5,806,193 | A | | 9/1998 | Ebihara |
| 5,830,612 | A | | 11/1998 | Yamada et al. |
| 6,137,111 | A | | 10/2000 | Yamada et al. |

(Continued)

FOREIGN PATENT DOCUMENTS

| EP | 0366420 A2 | 5/1990 |
| EP | 1 107 067 A2 | 6/2001 |

(Continued)

*Primary Examiner* — Phillip A Johnston
(74) *Attorney, Agent, or Firm* — Blakely Sokoloff Taylor & Zafman (57) ABSTRACT

The invention relates to a charged particle beam lithography system comprising: a charged particle optical column arranged in a vacuum chamber for projecting a charged particle beam onto a target, wherein the column comprises deflecting means for deflecting the charged particle beam in a deflection direction, a target positioning device comprising a carrier for carrying the target, and a stage for carrying and moving the carrier along a first direction, wherein the first direction is different from the deflection direction, wherein the target positioning device comprises a first actuator for moving the stage in the first direction relative to the charged particle optical column, wherein the carrier is displaceably arranged on the stage and wherein the target positioning device comprises retaining means for retaining the carrier with respect to the stage in a first relative position.

11 Claims, 9 Drawing Sheets

(56) References Cited

U.S. PATENT DOCUMENTS

| | | | |
|---|---|---|---|
| 6,559,456 B1 | 5/2003 | Muraki | |
| 6,683,433 B2 * | 1/2004 | Lee | 318/649 |
| 6,730,916 B1 | 5/2004 | Tsuji et al. | |
| 6,750,625 B2 | 6/2004 | Binnard et al. | |
| 6,937,911 B2 * | 8/2005 | Watson | 700/60 |
| 7,012,264 B2 | 3/2006 | Terken et al. | |
| 7,075,093 B2 | 7/2006 | Gorski et al. | |
| 7,138,629 B2 | 11/2006 | Noji et al. | |
| 7,276,714 B2 | 10/2007 | Platzgummer et al. | |
| 7,348,752 B1 | 3/2008 | Butler | |
| 7,959,141 B2 | 6/2011 | Makino | |
| 8,362,450 B2 | 1/2013 | Iizuka et al. | |
| 2001/0013927 A1 | 8/2001 | Itoh et al. | |
| 2001/0045526 A1 | 11/2001 | Itoh et al. | |
| 2002/0150398 A1 | 10/2002 | Choi et al. | |
| 2003/0173833 A1 | 9/2003 | Hazelton et al. | |
| 2004/0012765 A1 | 1/2004 | Akutsu et al. | |
| 2004/0031932 A1 | 2/2004 | Vosters et al. | |
| 2004/0041101 A1 | 3/2004 | Akutsu | |
| 2004/0141169 A1 | 7/2004 | Wieland et al. | |
| 2005/0045821 A1 | 3/2005 | Noji et al. | |
| 2005/0205809 A1 | 9/2005 | Uchida | |
| 2005/0211867 A1 | 9/2005 | Margeson | |
| 2005/0269525 A1 | 12/2005 | Terken et al. | |
| 2008/0067967 A1 | 3/2008 | Butler | |

FOREIGN PATENT DOCUMENTS

| | | |
|---|---|---|
| EP | 1383157 | 1/2004 |
| JP | S62114438 | 7/1987 |
| JP | S63138292 | 6/1988 |
| JP | H03237709 | 10/1991 |
| JP | H0577126 | 3/1993 |
| JP | H06120105 | 4/1994 |
| JP | H09197653 | 7/1997 |
| JP | H11191585 | 7/1999 |
| JP | 201126651 | 5/2001 |
| JP | 2001344833 | 12/2001 |
| JP | 2004055767 | 2/2004 |
| JP | 2004158657 | 6/2004 |
| JP | 2004327121 | 11/2004 |
| JP | 2005268268 | 9/2005 |
| JP | 2005347756 | 12/2005 |
| JP | 2006505124 | 2/2006 |
| JP | 2008141165 | 6/2008 |
| WO | WO 02086951 | 10/2002 |
| WO | WO 2004040614 | 5/2004 |
| WO | 2010021543 A2 | 2/2010 |

* cited by examiner

CHARGED PARTICLE BEAM LITHOGRAPHY SYSTEM AND TARGET POSITIONING DEVICE

BACKGROUND

The present invention relates to a charged particle beam exposure system, such as a lithography system for maskless image projection, scanning and non-scanning electron microscopes, and the like.

Charged particle beam lithography systems, such as electron beam maskless lithography systems, are generally known and, relative to conventional mask based lithography systems, have the advantage of fabrication on demand as it were, due to an absence of the necessity to change and install masks or reticles. In stead, the image to be projected for the manufacture of integrated circuits is stored in a memory of a computer that controls the maskless exposure system.

The known charged particle beam exposure systems commonly comprise a charged particle column placed in a vacuum chamber. The charged particle column comprises a charged particle source including a charged particle extraction means and electrostatic lens structures for the purpose of focussing and deflecting one or a multiplicity of charged particle beams on and over a target, such as a wafer. Furthermore the charged particle column comprises modulation means for modulating the one or multiplicity of charged particle beams, depending whether the image to be projected requires an exposure at a certain location or not.

During such projection the target is guided relative to the projection area of said charged particle column, by means of a stage that supports the target. For this new type of maskless lithography, appropriate stages have hardly been designed, at least are not commercially available. Known stages, for as tar as they can be adapted to maskless lithography, are mostly inappropriate at least in the sense of e.g. size, costs and vacuum compatibility.

Also electromagnetic dispersion fields as commonly present at actuators, in particularly electromagnetic actuators, are normally not desired in such systems, because any variation in electric of magnetic fields may affect the position of charged particle beams. It is known that fluctuations in electromagnetic fields due to an electromagnetic actuator can be reduced by arranging the electromagnetic actuator at a position remote from a target-bearing surface and providing a multiple shield in the electromagnetic actuator.

It is an object of the present invention to provide a charged particle beam lithography system comprising and an operating method using a target positioning device optimized for charged particle beam exposure of a target.

SUMMARY OF THE INVENTION

According to a first aspect, the present invention provides a charged particle beam lithography system comprising:

a charged particle optical column arranged in a vacuum chamber for projecting a charged particle beam onto a target, wherein the column comprises deflecting means for deflecting the charged particle beam in a deflection direction, a target positioning device comprising a carrier for carrying the target, and a stage for carrying and moving the carrier along a first direction, wherein the first direction is different from the deflection direction, and wherein the target positioning device comprises a first actuator for moving the stage in the first direction relative to the charged particle optical column, wherein the carrier is displaceable arranged on the stage and wherein the target positioning device comprises retaining means for retaining the carrier with respect to the stage.

During the exposure of a target in the lithography system according to the invention, the target is moved relative to the one or more charged particle beams in the first direction by activating the first actuator, and simultaneously the defecting means in the optical column are activated for deflecting the one or more charged particle beams in the deflection direction. With such an exposure, an elongated area of the target can be exposed for projecting the image to be projected at this area. The length of this elongated area is determined by the travel range of the stage, and the width of the elongated area is determined by the extent of deflection. During the illumination of this elongated area, the target on top of the carrier is maintained essentially on the same position. After the elongated area has been illuminated, the carrier with the target on top, can be displaced such that a new area can be exposed to the charged particle beams. In order to maintain the position of the carrier relative to the stage, at least along the deflection direction, at least during a projection, the target positioning device of the invention comprises retaining means for retaining the carrier with respect to the stage. The retaining means can stably retain the stage, in particular during the driving of the stage in the first direction.

Preferably the retaining means is arranged such that when the stage is retained, there is no or at least a minimum of leakage magnetic and/or electric fields, and/or fluctuations of such fields. In this case, there is no disturbance and/or interference of the trajectory and thus of the positions of the charged particle beams.

In an embodiment the carrier is displaceable along a second direction, wherein said second direction is different from said first direction, preferably wherein said second direction is substantially the same as the deflection direction. In a further embodiment, said second direction is substantially perpendicular to the first direction, this providing an orthogonal target positioning.

In an embodiment the stage is a first stage, and wherein the target positioning device comprises a second stage in between the carrier and the first stage, wherein the second stage is arranged for moving the carrier in the second direction, and wherein the retaining means are arranged for holding or blocking a movement of the second stage.

In a first embodiment, the retaining means comprises a piezoelectric motor for moving the carrier in the second direction. Piezoelectric motors, in particular resonant piezoelectric motors, can provide both a driving action for moving the carrier in the second direction, and a retaining action for holding the position of the carrier relative to the stage, at least during a projection. The piezoelectric motor is preferably arranged as actuator of the second stage. Using such a piezoelectric motor in the lithography system according to the invention, this motor does not require to be shielded from the charged particle optical column, at least during a retaining action. Such a piezoelectric motor can be arranged close to the carrier and the target on top, which may enhance the accuracy of the positioning of the carrier with respect to the stage. Furthermore, such the piezoelectric motor may be arranged inside a shielding means for at least partially shielding the charged particle optical column from ambient magnetic and/or electric fields.

In an embodiment, the carrier is interposed and/or restrained between two opposing piezoelectric motors. In this case any force or momentum exerted by one of the piezoelectric motors on the carrier may at least partially be compensated by a force or momentum exerted by the other of the two opposing piezoelectric motors. This provides a highly accurate and stable retaining of the carrier during the exposure of a target, and/or a highly accurate and stable moving of the carrier along the deflection direction, for example between subsequent exposures.

In a second embodiment, the retaining means comprises extendable and retractable clamping means which can be placed in an extended position for clamping and thus retaining the carrier with respect to the stage, and in a retracted position for releasing the carrier with respect to the stage and allowing a displacement of the carrier with respect to the stage. These clamping means may provide a mechanical interlocking between the carrier and the stage.

In an embodiment, the retaining means comprises releasable locking means for locking the position of the carrier with respect to the stage, and for allowing a displacement of the carrier with respect to the stage when the locking means are released. These locking means may provide a mechanical interlocking between the carrier and the stage.

In an embodiment the clamping or locking means comprises piezoelectric elements. Such piezoelectric elements can be driven by electrical signals and are highly suitable for use in the ultra clean and vacuum environment as usually required for lithography systems.

In an embodiment the target positioning device comprises a second actuator, preferably separate from the clamping or locking means, for moving the carrier in the second direction. In this embodiment, there is no holding momentum required from this second actuator, when the position of the carrier is retained with respect to the stage by the retaining means. When the carrier is retained, the second actuator can be shut down in order to further decrease any magnetic and/or electric fields, at least during an image projection.

In an embodiment, the second actuator is arranged for reducing and/or minimizing of leakage magnetic and/or electric fields outside the second actuator, such as electromagnetic dispersion fields, at least when the second actuator is switched off.

In order to reduce the leakage of magnetic and/or electric fields, said second actuator may be provided with shielding means for at least partially shielding against leakage of magnetic and/or electric fields outside the second actuator.

Alternatively or additionally, in an embodiment the second actuator comprises an induction motor. In an embodiment the induction motor comprises a chore of non-ferromagnetic material. In an embodiment the non-ferromagnetic material comprises aluminum. Such actuators are essentially free from any magnetic material and therefore do not exhibit leakage magnetic and/or electric fields outside the actuator, at least when shut down. Using such a second actuator in the lithography system according to the invention, this second actuator does not require to be shielded from the charged particle optical column. Such a second actuator can be arranged close to the carrier and the target on top, which may enhance the accuracy of the positioning of the carrier with respect to the stage. Furthermore, such a second actuator may be arranged inside a shielding means for at least partially shielding the charged particle optical column from ambient magnetic and/or electric fields.

In contrast, the first actuator, which is driven during the projection of a charged particle beam onto the target, is preferably arranged outside an optical column shielding means which may be provided for at least partially shielding the charged particle optical column from ambient magnetic and/or electric fields. Alternatively, or in addition, the first actuator may be arranged at a distance remote from the stage. In an embodiment the target positioning device is arranged in a vacuum chamber, wherein the first actuator is placed outside the first vacuum chamber. In an embodiment the optical shielding means is arranged as a lining of said first vacuum chamber or is integrated into the wall of said first vacuum chamber.

In an embodiment the target positioning device comprises coupling means for releasably coupling the carrier to the second actuator. Due to these coupling means, the carrier can be uncoupled from the second actuator, for example when the second actuator is in the retained position with respect to the stage. In this case any momentum from the second actuator is not transferred to the carrier. More important is that in this embodiment, a second actuator can be used which is arranged for providing a short and preferably accurate stroke for moving the carrier with respect to the stage. Essentially the combination of the above-mentioned retaining means and the coupling means provide the possibility for using a short stroke second actuator. In order to displace the carrier with respect to the stage, a method can be used which comprises the steps of:

a. activating the coupling means and preferably deactivating the retaining means;

b. activating the second actuator for moving the carrier in the second direction;

c. deactivating the second actuator and preferably activating the retaining means;

d. deactivating the coupling means; and e. activating the second actuator for returning the second actuator, in particular a drive member thereof, backwards in the second direction. In order to establish a further step in the second direction, the coupling means are again activated and the retaining means are deactivated, and the further above-mentioned steps are repeated.

In an embodiment the coupling means comprises piezo-electric elements. In an embodiment said piezo-electric elements are arranged for coupling the carrier to the second actuator in an extended position of said piezo-electric elements, and for uncoupling the carrier to the actuator in a retracted position of said piezo-electric elements. In an embodiment said piezo-electric elements are arranged such that the carrier rests on top of said second actuator, at least when the carrier is coupled to the second actuator.

According to a second aspect, the invention provides a target positioning device for a charged particle beam lithography system as described above.

According to a third aspect, the invention provides a method of projecting an image onto an area of a target in a charged particle beam lithography system as described above, in particular wherein the method comprising the steps of:

i. activating the retaining means;

ii. projecting at least a part of the image onto at least part of the area using a combination of the following steps of: activating the first actuator from moving the target in the first direction, activating the charged particle optical column for projecting the charged particle beam onto the target, and activating the deflecting means for deflecting the charged particle beam in a deflection direction;

iii. moving the charged particle optical beam outside the area and/or deactivating the charged particle optical column; and iv. deactivating the retaining means for moving the carrier in the second direction.

According to a fourth aspect, the invention relates to a method of projecting an image onto an area of a target in the charged particle beam lithography system as described above, in particular wherein the target positioning device comprises a first actuator for moving the stage in the first direction relative to the charged particle optical column, and wherein the target positioning device comprises a piezoelectric motor for moving the carrier in the second direction, wherein the method comprises the steps of:

i. controlling the piezoelectric motor for retaining the position of the carrier against movement in the second direction;

ii. projecting at least a part of the image onto at least part of the area using a combination of the following steps of: activating the first actuator for moving the target in the first direction, activating the charged particle optical column for projecting the charged particle beam onto the target, and activating the deflecting means for deflecting the charged particle beam in a deflection direction;

iii. moving the charged particle optical beam outside the area and/or deactivating the charged particle optical column; and iv. controlling the piezoelectric motor for moving the carrier in the second direction.

According to a fifth aspect, the invention relates to a method of projecting an image onto an area of a target in the charged particle beam lithography system as described above, in particular wherein the target positioning device comprises a first actuator for moving the stage in the first direction relative to the charged particle optical column, and wherein the target positioning device comprises a second actuator for moving the carrier in the second direction, wherein the method comprises the steps of:

i. deactivating the second actuator and activating the retaining means for retaining the position of the carrier against movement in the second direction;

ii. projecting at least a part of the image onto at least part of the area using a combination of the following steps of: activating the first actuator for moving the target in the first direction, activating the charged particle optical column for projecting the charged particle beam onto the target, and activating the deflecting means for deflecting the charged particle beam in a deflection direction;

iii. moving the charged particle optical beam outside the area and/or deactivating the charged particle optical column; and iv. deactivating the retaining means and activating the second actuator for moving the carrier in the second direction.

In an embodiment the above-mentioned methods further comprises the step of:

v. moving the carrier in the second direction over a distance equal or smaller then the extent of the deflection of the charged particle beam by the deflecting means, in the second direction.

In an embodiment, the steps i, ii, iii, iv and v of the above-mentioned methods are repeated, preferably successively repeated.

In an embodiment of the above-mentioned methods, the charged particle optical column is deactivated by preventing the charged particle beam to reach the target. In an embodiment of the above-mentioned method, each said particle optical column is deactivated by switching off a charged particle source of the column or by switching a cathode of the charged particle source to a higher positive potential and an anode of the charged particle source, wherein said charged particle source preferably is an electron source.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
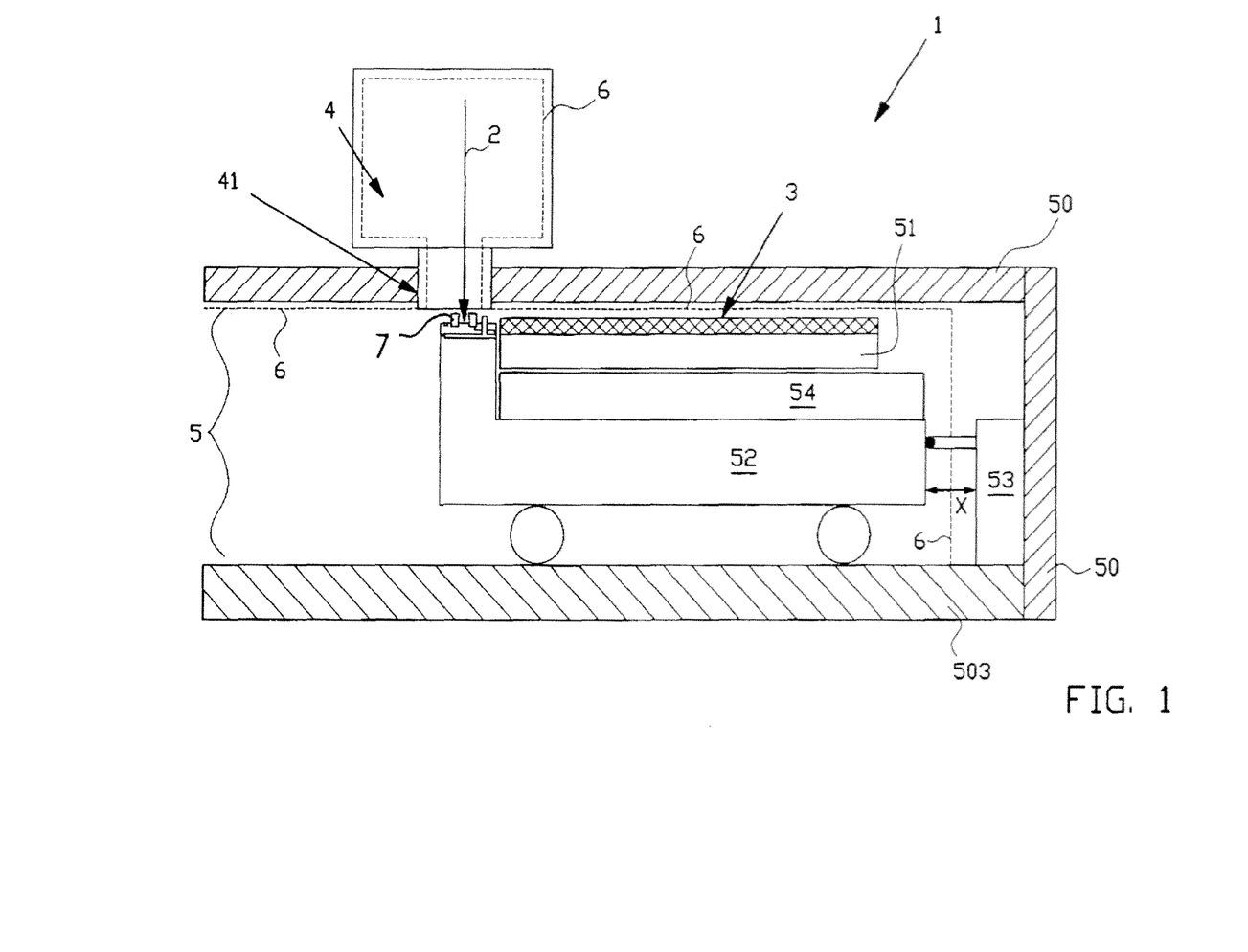
FIG. 1 is a schematic illustration of a charged particle lithography system.

FIG. 1 schematically shows a system 1 for charged particle beam lithography, using a massive array of parallel charged particle beams, so called cp-beams. In the present example the charged particle beams are electron beams. One of such cp-beams 2 is represented in FIG. 1.

All cp-beams are controlled separately by means of a modulator in a known manner, enabling a writing of a desired pattern on a target 3, in this case a wafer. The main advantages of this system compared to the commonly used optical systems are the writing of very small structures and the absence of expensive masks. The latter significantly reduces the start-up costs of a batch, making the present system highly advantageous for prototyping and medium volume production.

The system according to the invention consists of three major subsystems, namely a data path subsystem (not shown in FIG. 1), a charged particle optical column 4, for example an electron-optical column, and a target positioning device 5.

The charged particle optical column 4 creates a massive array of predominantly parallel, focused cp-beams 2, emerging from the bottom of the column 4. Each cp-beam is controlled by said data path. In a manner known per se, the cp-beams are switched "on" and "off" and the positions of the cp-beams are adjusted within a small range in accordance with the data. In a final part of the charged particle optical column, in fact at a projection lens 41, the cp-beams 2 are deflected back and forth, substantially transversely to a first direction X of movement of the target or wafer module 51, so as to enable writing of features, alternatively denoted structures, on the target 3.

Due to the nature of cp-beams 2, their trajectory can be changed by magnetic and/of electric fields. In the charged particle optical column 4 this is used to control the cp-beams 2 and to project the cp-beams 2 onto the target 3. In order to shield the charged particle optical column 4 from ambient magnetic and/or electric fields, which might disturb the trajectories of the cp-beams 2 and thus induces a deviation from the desired location of the cp-beams 2 on the target 3, at least the charged particle optical column 4 is provided with a shielding 6 comprising one or more layers of a μ-metal. In the example as shown in FIG. 1, also the target positioning device 5 is placed inside the shielding 6. The shielding 6 is in a convenient manner arranged as a lining of the vacuum-chamber for the charged particle optical column 4 and the vacuum-chamber of the target positioning device 5. Such shielding is arranged to attenuate the earth magnetic field by a considerable extent. In the arrangement at stake, attenuation by a factor of approximately 1000 is realized.

The target positioning device 5 places a target 3 in the focal plane of the charged particle optical column 4 and moves it underneath. The target positioning device 5 comprises a target module 51 for holding a target and a stage assembly for moving the target in the first X-direction by means of a stage, further referred herein as x-stage 52, and in a second Y-direction by means of a carrier, further referred herein as y-stage 54. In this exemplary embodiment the X-direction is substantially perpendicular to the Y-direction, and the X and Y-directions form a plane which is substantially perpendicular to the charged particle optical column 4.

As discussed above, during the writing of a pattern, the cp-beams 2 are deflected back and forth transversely to the X-direction and the target 3 is moved underneath along the X-direction by moving the x-stage 52 using the first actuator 53. Such a scan results in a writing path with a width which is determined by the extent of deflection of the cp-beams 2 in the deflection direction, and with a length which is determined by the length of travel of the x-stage 52. In particular the length of the writing path can extend over the whole target 3 area.

During the writing of each writing path, essentially only the first actuator needs to be driven. In order to shield the charged particle optical column 4 during the writing of a pattern from magnetic and/or electric fields from the first actuator 53, the first actuator 53 is arranged outside the shielding 6. Thus, the shielding means 6 for the optical column 4 can also be used for shielding the charged particle optical column 4 from magnetic and/or electric fields from the first actuator 53.

In the exemplary embodiment as shown in FIG. 1, the first actuator 53 is arranged inside the vacuum chamber 50 of the target positioning device 5. Alternatively, the first actuator 53 may be arranged outside the vacuum chamber 50 of the target positioning device 5.

Furthermore, both the first actuator 53 and the stage 52 are rigidly connected with respect to each other. In the example shown in FIG. 1, both the first actuator 53 and the stage 52 are rigidly connected to the a base plate 503. This rigid connection ensures that a proper alignment of the actuator or motor 53 with respect to the stage 52 is maintained. In an embodiment, the base plate 503 is arranged to provide a highly stiff construction, preferably with a low coefficient of thermal expansion. In an embodiment the base plate 503 comprises a granite slab or a granite table top.

During the writing of a writing path, thus when the cp-beams 2 are projected onto the target 3, essentially only the first actuator 53 is driven (except maybe for performing small corrections in a Z-direction, which is substantially perpendicular to the XY-plane). During any other movements, other than during writing, magnetic and/or electric fields and fluctuations therein are allowable. Thus the actuators for moving the target positioning device 5 in the Y- and/or Z-direction are placed inside the shielding 6 for the optical column 4.

When moving the target 3 along the Y-direction, for example for moving the target 3 towards a next writing path after a previous writing path has been written, the cp-beams 2 can be prevented to reach the target 3, for example by switching off the beams 2, and/or the target 3 can be moved to a location where the cp-beams 2 are outside the area on the target 3 which is to be illuminated by the cp-beams 2. During this movement in the Y-direction, magnetic and/or electric fields and fluctuations therein are allowable.

For example, the target positioning device 5 can be moved in X-direction, such that the cp-beams 2 fall into a beam sensor 7, as shown in FIG. 1, which is placed on the x-stage 52 adjacent to the target table 51. During the movement in the Y-direction, the beam sensor 7 may be used for measuring characteristic properties of the cp-beams 2 prior to writing a next writing path.

Figure 2:
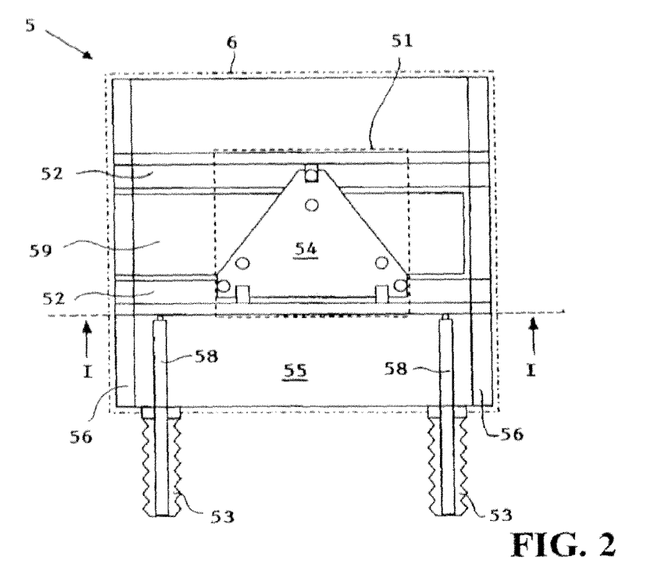
FIG. 2 is a schematic plan view of a first exemplary embodiment of a XY stage of a target positioning device according to the invention.
Figure 3:
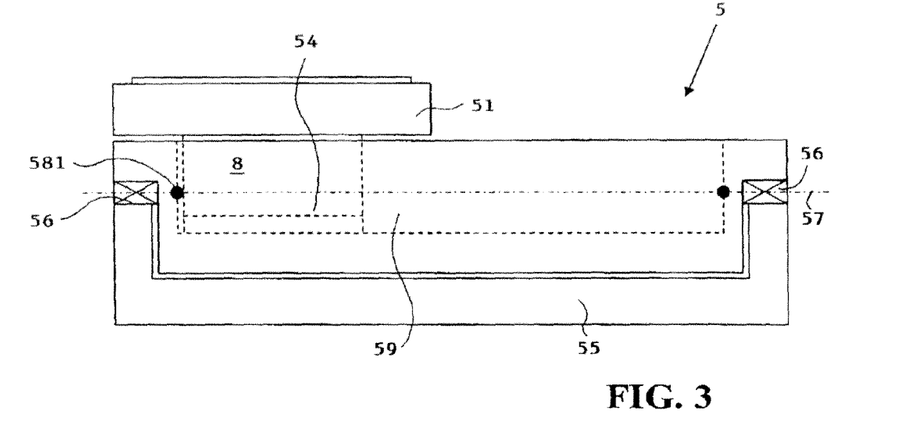
FIG. 3 is a schematic view in cross-section along the line I-I in FIG. 2.

An exemplary embodiment of the target positioning device 5 is shown in more detail in FIGS. 2 and 3. In this embodiment, the target positioning device 5 comprises a support frame 55 with two linear bearings 56 which extend in the X-direction. The level of the centre of gravity 57 of the target positioning device 5 lies in a plane through the bearings 56.

The bearings 56 support the x-stage 52 and allow for a smooth movement of the x-stage 52 along the X-direction. For driving the x-stage 52, two first or x-actuators 53 are provided. These x-actuators 53 are placed outside the shielding 6. Each of the x-actuators 53 comprises a push-pull rod 58 which extends through the shielding 6 and connects to the x-stage 52. As shown in FIG. 3, the point of application where the x-actuator 53 via the push-pull rod 58 applies force to the x-stage 52 is positioned at the level of the centre of gravity 57 of the target positioning device 5.

On top of the x-stage 52, the y-stage 54 is placed. The y-stage 54 comprises a short stroke actuator 59 which will be described in more detail below.

On top of the y-stage 54, a target module 51 is placed. This target module 51 may be provided with a short stroke stage with six degrees of freedom, on top of which a target table is placed for holding a target.

Figure 4A:
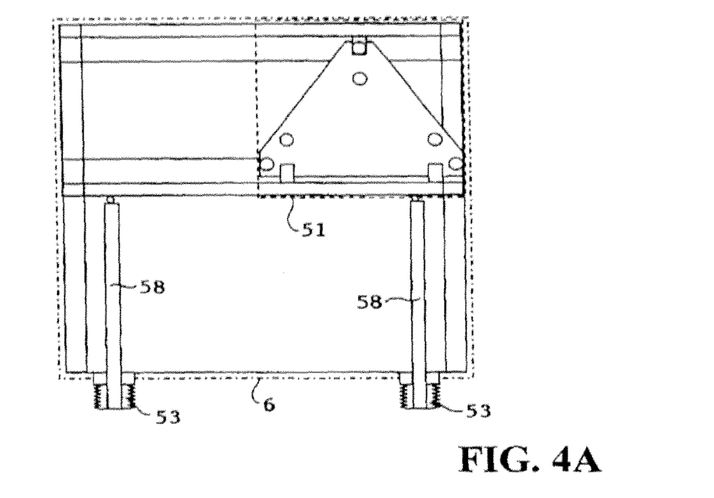
FIGS. 4A and 4B schematically show displacement of the XY stage in the first or X direction.
Figure 4B:
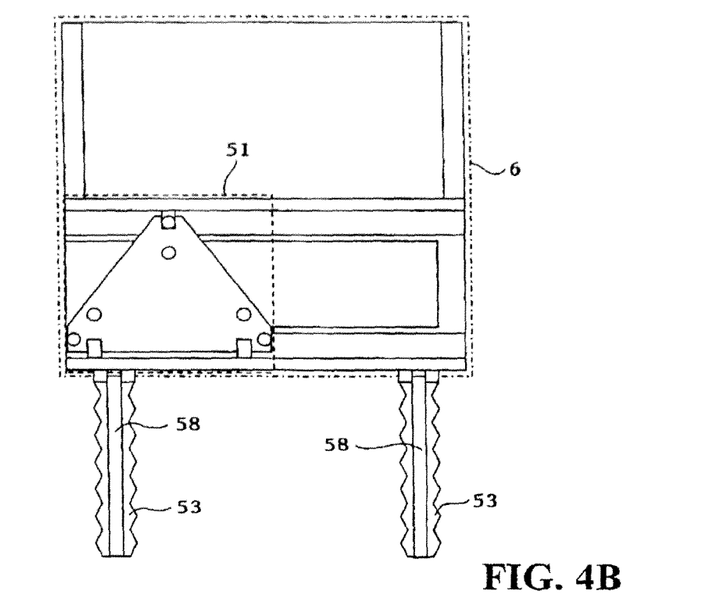

As shown in FIGS. 4A and 4B, the target module 51 can be moved along the X-direction by extending or retracting the push-pull rods 58 by the first actuators 53.

Figure 5A:
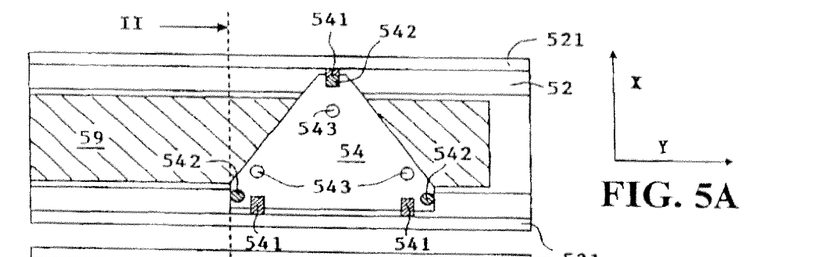
FIGS. 5A-5E schematically show a displacement of the XY stage in the second or Y direction.
Figure 6:
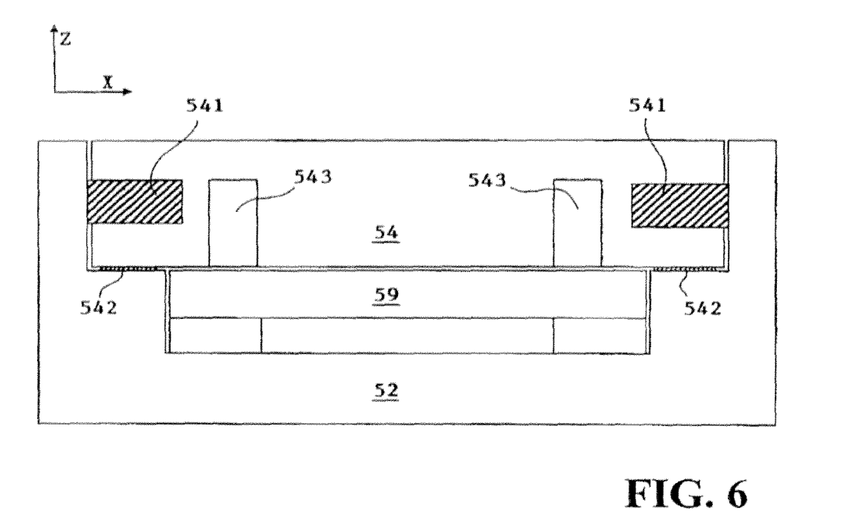
FIG. 6 schematically shows a cross-section of the XY stage during a displacement in the X-direction.
Figure 7:
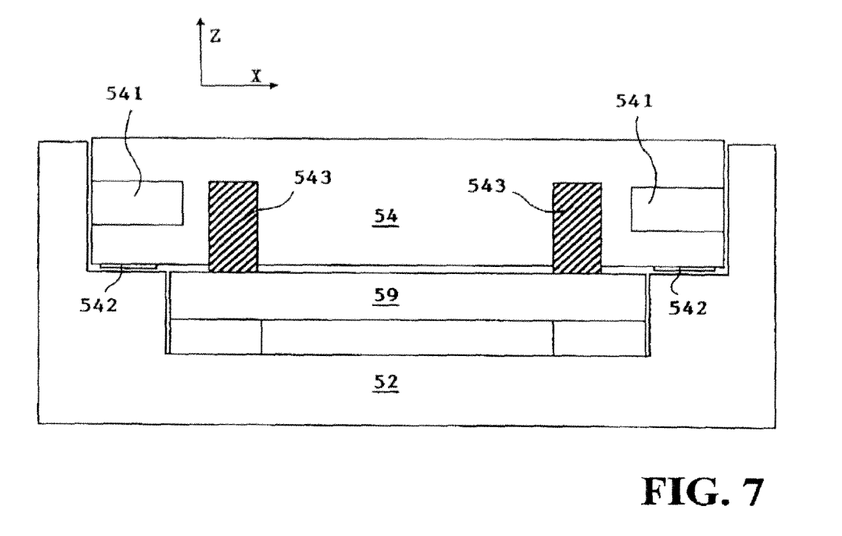
FIG. 7 schematically shows a cross-section of the XY stage during a displacement in the Y-direction.

FIGS. 5A-5E schematically show the functioning of the short stroke actuator 59 of the y-stage 54. FIGS. 6 and 7 schematically show a cross-section of the y-stage along the line II-II of FIGS. 5A-5E. Activated piezoelectric elements are presented with a shaded or hatched area in these figures.

When the x-stage 52 is driven for performing a writing of a pattern, the position of the target module 51 on the y-stage 54 is fixed and retained. In order to retain the position of target module 51 on the y-stage 54 with respect to the x-stage 52 in the Y-direction, the y-stage 54 is provided with first piezo-electric elements 541 which can be placed in a retaining position as shown in FIGS. 6 and 5A, in which the piezo-electric elements 541 clamp the y-stage 54 between sidewalls 521 of the x-stage 52. In order to provide the correct position in the Z-direction, the y-stage 54 is provided with second piezo-electric elements 542 which can be placed in a supporting position as shown in FIGS. 6 and 5A, in which the piezo-electric elements 542 rest on the x-stage 52.

Figure 5B:
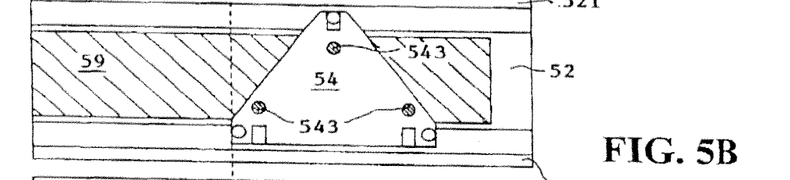

For moving the y-stage 54 in the Y-direction, the first piezo-electric elements 541 are placed in a release position as shown in FIGS. 7 and 5B, in which the piezo-electric elements 541 are retracted and do not provide a clamping force on the sidewalls 521 of the x-stage 52. Furthermore, the y-stage 54 is provided with third piezo-electric elements 543 which can be placed in a supporting position as shown in FIGS. 7 and 5B, in which the piezo-electric elements 543 and thus the y-stage 54 rests on the short stroke actuator 59, and the y-stage 54 is coupled to the actuator 59 by the coupling means 543. Note that in the retained or locked position as shown in FIGS. 6 and 5A, the third piezo-electric elements 543 are retracted and the y-stage 54 is not supported by the short stroke actuator 59.

Figure 5C:
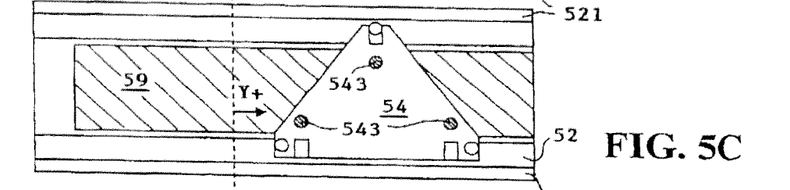

When the y-stage 54 rests on the short stroke actuator 59, as shown in FIG. 5B, the actuator 59 can make a short stroke in the Y-direction, as shown in FIG. 5C. During this stroke, the actuator 59 thus moves the target module 51 on the y-stage 54 in the Y-direction.

Figure 5D:
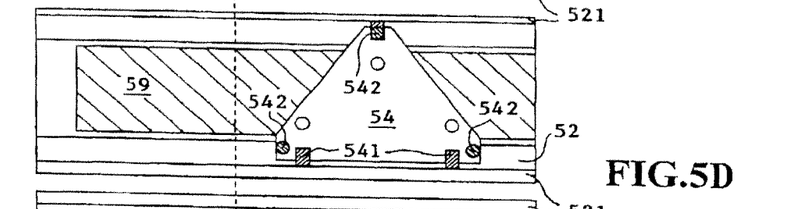
Figure 5E:
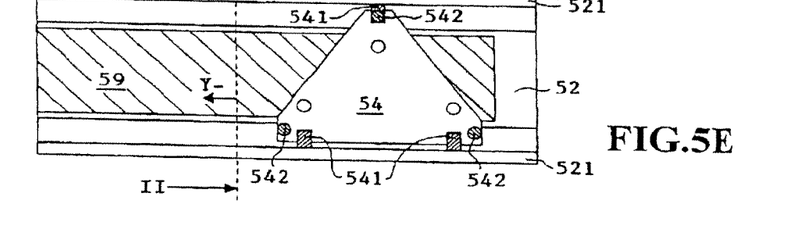

After moving the y-stage 54 in the Y-direction over a desired distance Y+, the second piezo-electric elements 542 are extended, the third piezo-electric elements 543 are retracted and the y-stage 54 is now supported by the x-stage 54 by the second piezo-electric elements 542 and is free from the short stroke actuator 59. Subsequently the first piezo-electric elements 541 are placed in a retaining position, in which the piezo-electric elements 541 clamp the y-stage 54 between sidewalls 521 of the x-stage 52, as shown in FIG. 5D.

Subsequently, the short stroke actuator 59 may return to its original position by moving back over a distance Y-, which results in the same situation for the short stroke actuator 59 is shown in FIG. 5A.

By repeating this procedure, the y-stage 54 can be moved stepwise along the Y-direction. When the short stroke actuator 59 initially is placed on the left-hand side, as shown in FIG. 5A, the y-stage 54 can be stepwise moved to the right. When the short stroke actuator 59 initially is placed on the right-hand side, as shown in FIG. 5D, the y-stage 54 can be stepwise moved to the left.

Figure 8:
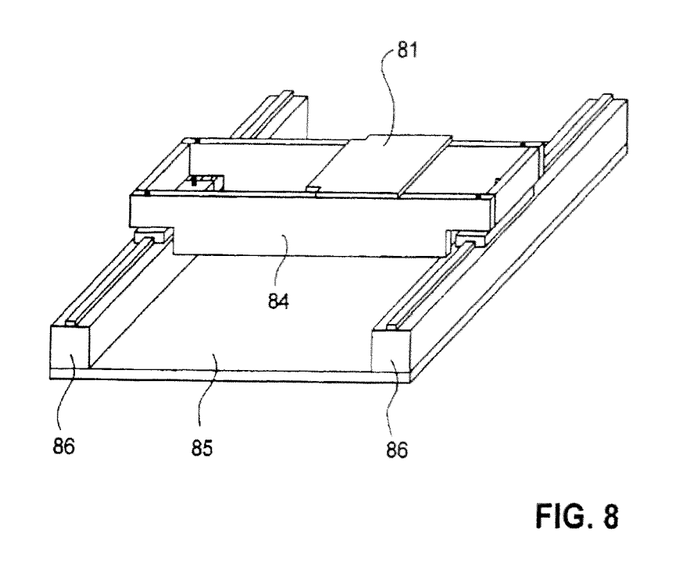
FIG. 8 schematically shows a second exemplary embodiment of a XY stage of a target positioning device according to the invention.
Figure 9:
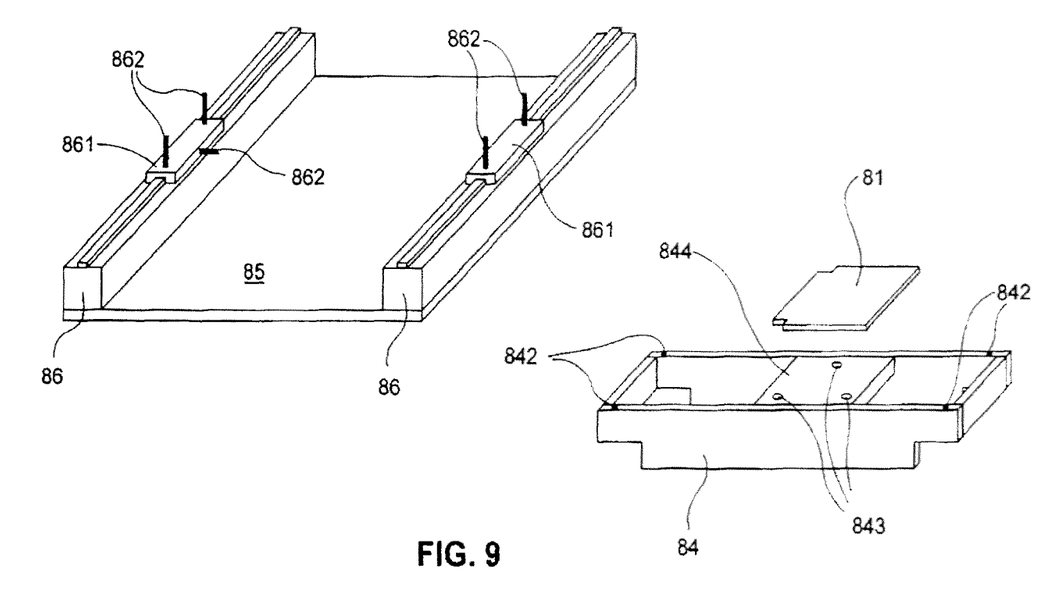
FIG. 9 schematically shows an exploded view of the XY stage of FIG. 8.

In a second exemplary embodiment as shown in FIG. 8, the XY-stage comprises two X-stage bases 86, both arranged on top of a common base plate 85. Each X-stage base 86 carries an X-stage carriage 861. The X-stage carriages 861 are provided with flextures 862 (see FIG. 9) for connecting a Y-beam 84 to the X-stage carriages 861. The Y-beam 84 bridges the space between the X-stages and is provided with interface members 842 for connecting to the flextures 862.

Figure 10A:
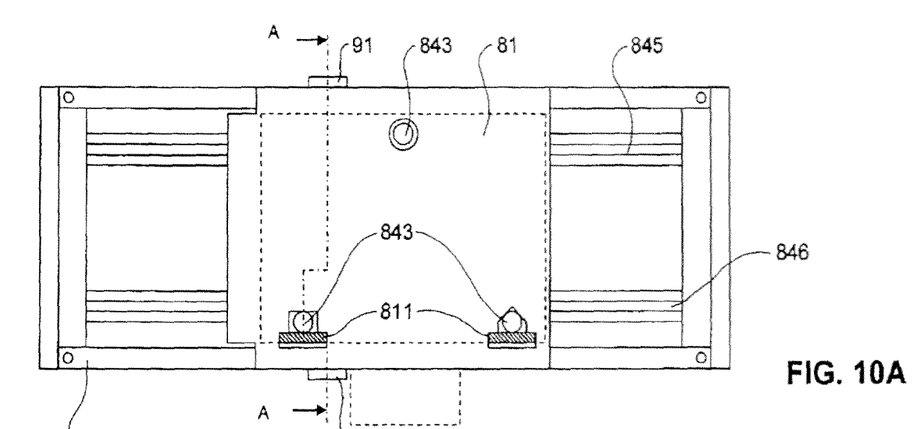
FIGS. 10A and 10B show a schematic plan view of the Y stage of FIG. 8.
Figure 10B:
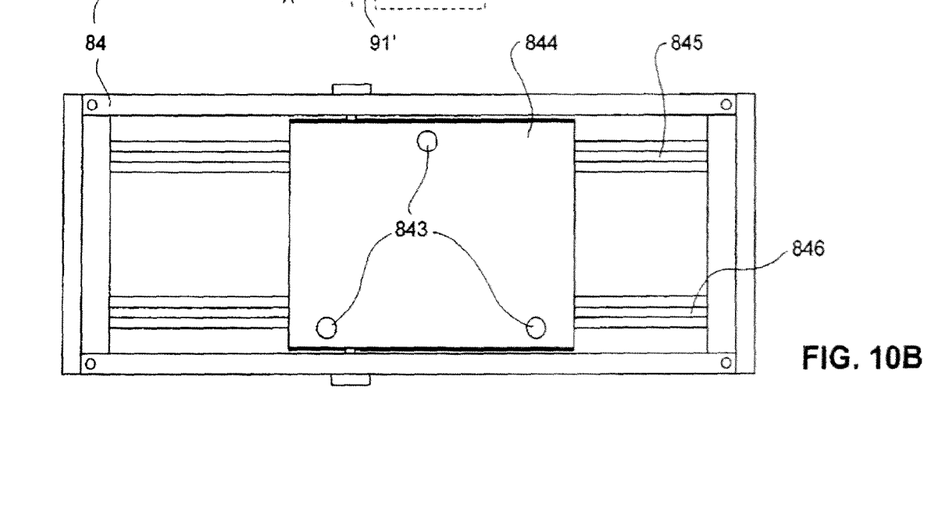

The Y-beam comprises a Y-stage having a Y-carriage 844 or carrier for carrying a target module (not shown). In particular, in use the target is arranged on top of a target module, and the target module is arranged on top of the Y-stage via an interface plate 81. The Y-carriage 844 or carrier is provided with interface pins 843, as shown in FIG. 10B, where the interface plate 81 is removed.

In particular the interface pins 843 may provide a kinematic mount in order to accurately position the target module on the carrier or Y-carriage 844. A mount is said to be kinematic when the number of degrees of freedom (axes of free motion) and the number physical constraints applied to the mount total six. The side of the interface plate 81 facing the Y-carriage 844 is therefore provided with a "cone, groove, and flat" mount schematically illustrated in FIG. 10A, wherein the interface pins 843 are retained in the groove and cone respectively by resilient members or springs 811.

Figure 11:
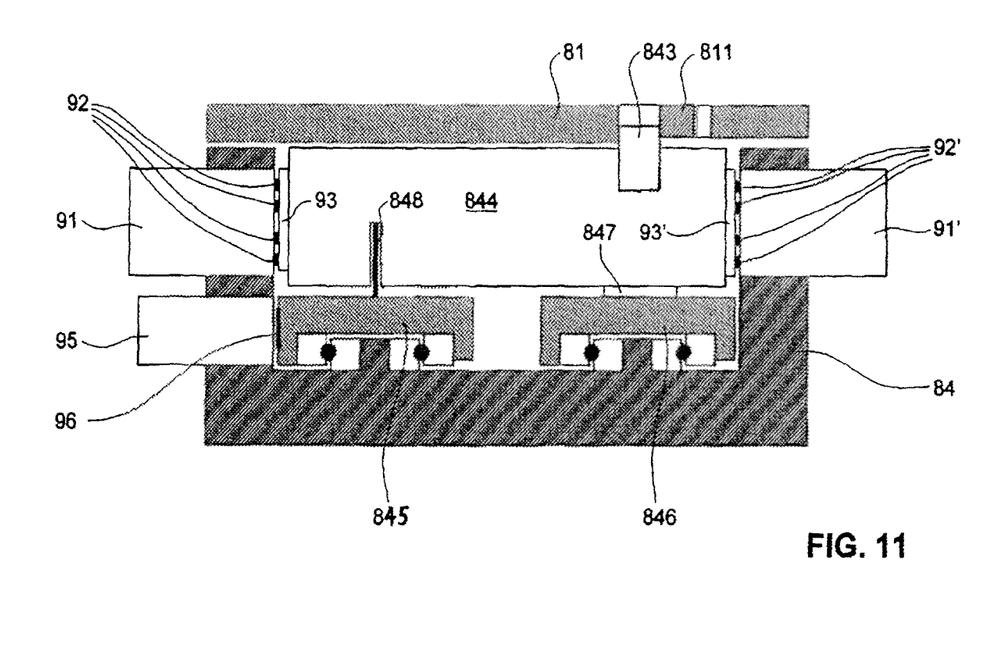
FIG. 11 schematically shows a cross-section along the line A-A in FIG. 10A.

As shown in the cross-section of FIG. 11, the Y-beam 84 provides a common base plate for two parallel arranged linear stages 845, 846. The carriages of these stages 845, 846 are pre-stressed and provide for the required stiffness of the construction.

In this embodiment the Y-carriage 844 is on the one hand rigidly connected to the carriage of the first stage 846 via a rigid interface 847, and is on the other hand connected to the carriage of the second stage 845 via a flexture 848 in order to absorb any thermal expansion of the stages 845, 846 and/or the Y-carriage 844.

Furthermore, at least one of the stages 845, 846, in this embodiment the second stage 845 is used, is provided with a ruler 96, which in cooperation with a linear encoder head 95 can provide positional information of the Y-carriage in the second or Y-direction.

In this embodiment both opposite side faces of the Y-beam 84, which extent along the Y-direction, are provided with a piezoelectric motor 91, 91', which both have extending members 92, 92' which are driven via piezoelectric elements. The extending member 92, 92' may act on the adjacent ceramic driving plates 93, 93', which are arranged on opposite side faces of the Y-carriage 844, on the one hand for retaining the position of the Y-carriage 844 with respect to the Y-beam 84, and on the other hand for moving the Y-carriage 844 along the stages 845, 646 of the Y-beam 44. In this exemplary embodiment, the Y-carriage 844 or carrier is interposed and restrained between two opposing piezoelectric motors 91, 91'.

It is to be understood that the above description is included to illustrate the operation of the preferred embodiments and is not meant to limit the scope of the invention. From the above discussion, many variations will be apparent to one skilled in the art that would yet be encompassed by the spirit an scope of the present invention.

For example, in stead of using piezo-electric elements, also other actuator may be used for clamping and thus retaining the carrier to the stage. Such alternative actuators may comprise pneumatic, hydraulic or other types of mechanical actuators.

The target positioning device with the retaining means according to the invention can thus be suitably be arranged to minimize variation in electric of magnetic fields that may disturb the trajectories of the charged particle beams, and thus to optimize a target positioning device for use in a charged particle exposure system, such as a lithography system for mask less image projection, in particular a multi-beam charged particle exposure system.

The invention claimed is:

1. Stage comprising two stage bases (86), both arranged on top of a common base plate (85), wherein each of said stage bases (86) carries a stage carriage (861), said stage carriages (861) being provided with flextures (862) for connecting a beam to the stage carriages (861).

2. Stage according to claim 1, wherein said flextures (862) lie in different planes.

3. Stage according to claim 1, wherein each stage carriage (861) is provided with at least two flextures (862).

4. Beam (84) for use in a stage according to claim 1, said beam (84), when said stage is in use, bridging the space between the stage bases (86), wherein said beam (84) is provided with interface members (842) for connecting to the flextures (862).

5. Beam according to claim 4, further comprising a carriage (844) wherein said carriage (844) is provided with interface pins (843) providing a kinematic mount.

6. Target positioning device (5) comprising a stage according to claim 1 and a beam according to claim 4.

7. Target positioning device (5) according to claim 6, further comprising an actuator (53), wherein said actuator (53) is adapted to apply a force to the stage via a drive member, with the point of application positioned at the level of the centre of gravity (57) of the target positioning device (5).

8. Target positioning device (5) according to claim 7, wherein two actuators (53) are provided.

9. Target positioning device (5) according to claim 8, wherein the actuators (53) and the points of application are arranged side by side and eccentrically, as taken in plan view.

10. Charged particle beam lithography system (1) comprising a target positioning device (5) according to claim 6.

11. Charged particle beam lithography system (1) according to claim 10 further comprising a vacuum chamber accommodating said target positioning device (5), and wherein the actuator (53) is arranged outside said vacuum chamber.

\* \* \* \* \*